United States Patent
Yang et al.

(10) Patent No.: US 7,943,856 B2
(45) Date of Patent: May 17, 2011

(54) COMPOSITION FOR PRODUCING PRINTED CIRCUIT BOARD AND PRINTED CIRCUIT BOARD USING THE SAME

(75) Inventors: Yoo Seong Yang, Daejeon (KR); Myung Sup Jung, Seongnam-si (KR); Chung Kun Cho, Suwon-si (KR); Sang Hyuk Suh, Daejeon (KR); Bon Hyeok Gu, Hwaseong-si (KR)

(73) Assignees: Samsung Electronics Co., Ltd. (KR); Samsung Electro-Mechanics Co., Ltd. (KR); Samsung Fine Chemicals Co., Ltd. (KR)

( * ) Notice: Subject to any disclaimer, the term of this patent is extended or adjusted under 35 U.S.C. 154(b) by 175 days.

(21) Appl. No.: 12/328,458

(22) Filed: Dec. 4, 2008

(65) Prior Publication Data

US 2009/0151987 A1 Jun. 18, 2009

(30) Foreign Application Priority Data

Dec. 14, 2007 (KR) .................. 10-2007-0130932
Sep. 10, 2008 (KR) .................. 10-2008-0089314

(51) Int. Cl.
*H05K 1/03* (2006.01)
*B32B 15/08* (2006.01)
*C09K 19/52* (2006.01)
*C09K 19/54* (2006.01)

(52) U.S. Cl. ............ 174/256; 174/250; 428/195.1; 428/458; 428/901; 252/299.01; 252/299.5; 427/99.4

(58) Field of Classification Search ............ 252/299.01, 252/299.5; 428/195.1, 458, 901; 157/254, 157/257, 258; 427/96.1, 99.4; 174/254, 174/257, 258, 256
See application file for complete search history.

(56) References Cited

U.S. PATENT DOCUMENTS

| | | | | |
|---|---|---|---|---|
| 5,167,985 A | * | 12/1992 | Ito et al. | 427/96.1 |
| 7,514,126 B2 | * | 4/2009 | Suemasu | 428/1.1 |
| 2009/0092800 A1 | * | 4/2009 | Yang et al. | 428/195.1 |

FOREIGN PATENT DOCUMENTS

JP 11092647 4/1999

* cited by examiner

*Primary Examiner* — Shean C Wu
(74) *Attorney, Agent, or Firm* — Cantor Colburn LLP

(57) ABSTRACT

A composition for producing a printed circuit board is provided. The composition includes a polyamic acid having one or two crosslinkable functional groups introduced at one or both ends thereof, a liquid crystal polymer (LCP) or a liquid crystalline thermoset (LCT) oligomer, and an organic solvent. Therefore, the composition can be used as a material for next-generation boards that are becoming gradually lighter in weight and smaller in thickness and size. Further provided is a printed circuit board produced using the composition.

14 Claims, No Drawings

COMPOSITION FOR PRODUCING PRINTED CIRCUIT BOARD AND PRINTED CIRCUIT BOARD USING THE SAME

CROSS-REFERENCE TO RELATED APPLICATIONS

This application claims priority to Korean Patent Application No. 10-2007-130932, filed on Dec. 14, 2007 and to Korean Patent Application No. 10-2008-89314, filed on Sep. 10, 2008, and all the benefits accruing therefrom under 35 U.S.C. §119, the contents of which in their entireties are herein incorporated by reference.

BACKGROUND

1. Field

The present disclosure is directed to a composition for producing a printed circuit board and a printed circuit board produced using the composition. More specifically, the composition comprises a polyamic acid having one or two crosslinkable functional groups introduced at one or both ends thereof and a liquid crystal polymer (LCP) or a liquid crystalline thermoset (LCT) oligomer.

2. Description of the Related Art

With a drastic increase in the complexity of electronic devices, circuit boards are replacing many portions of interconnect lines. Further, flexible printed circuit (FPC) boards are rapidly displacing conventional printed circuit boards (PCBs) as electronic devices are become smaller in size and thickness, lighter in weight, and more integrated. Particularly, recent developments of portable electronic devices such as cellular phones, notebook computers and camcorders have led to the rapid growth of the market for flexible boards.

Bismaleimide-triazine (BT) and glass epoxy resins (e.g., FR-4) are mainly used as board materials. However, these materials fail to provide satisfactory results, in areas such as, for example, excellent mechanical properties, low permittivity, high heat resistance, low thermal expansion and low moisture absorption, which are required for subsequent packaging. Thus, there is a need to develop novel materials that meet the requirements of next-generation boards.

SUMMARY

Disclosed herein is a composition for producing a printed circuit board which includes a polyamic acid having one or two crosslinkable functional groups introduced at one or both ends thereof, a liquid crystal polymer or a liquid crystalline thermoset oligomer and an organic solvent wherein the polyamic acid has a structure represented by Formula 1:

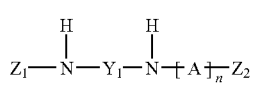
(1)

wherein A is represented by Formula 2:

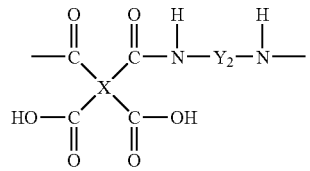
(2)

in which X is a tetravalent aliphatic or aromatic organic group and $Y_2$ is a divalent aliphatic or aromatic organic group, $Z_1$ and $Z_2$, which may be identical to or different from each other, are independently a monovalent crosslinkable functional group having at least one carbon-carbon double bond, $Y_1$, which may be identical to or different from $Y_2$, is a divalent aliphatic or aromatic organic group, and n is an integer from 1 to about 1,000, provided that when n is 2 or greater, the repeating units A may be the same or different.

Also disclosed herein is a film or prepreg produced using the composition wherein the film is produced by casting the composition on a substrate and the prepreg is produced by impregnating the composition into a reinforcing material.

Also disclosed herein is a printed circuit board having the prepreg.

DETAILED DESCRIPTION

Exemplary embodiments will now be described in greater detail hereinafter. These exemplary embodiments may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on, the other element or intervening elements may be present. As used herein, the term "and/or" includes any and all combinations of one or more of the associated listed items.

It will be understood that, although the terms first, second, third, and the like, may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments will be described in detail.

A composition for producing a printed circuit board comprises a polyamic acid having one or two crosslinkable functional groups introduced at one or both ends thereof, a liquid crystal polymer or a liquid crystalline thermoset oligomer, and an organic solvent. Specifically, the composition is prepared by blending a liquid crystal polymer or a liquid crystalline thermoset oligomer, with a polyamic acid having crosslinkable groups introduced at at least one end thereof to achieve high heat resistance and low thermal expansion. The composition is formed into a thin film, followed by high-temperature curing to realize excellent film characteristics, such as high heat resistance and low thermal expansion. Without being limited by theory, it is believed that the polyamic acid crosslinks with the liquid crystal polymer or a liquid crystalline thermoset oligomer to improve the high heat resistance and low thermal expansion.

A board (e.g., a printed circuit board) can be produced using the composition. The composition either has no glass transition temperature or if it does have a glass transition temperature, the glass transition temperature is greater than or equal to about 250° C. The composition also has a coefficient of thermal expansion (CTE) not higher than about 20 ppm/° C. As a result of these properties, the composition is suitable for use as a board material necessary for the packaging of highly integrated devices that are becoming increasingly smaller, thinner and have a lighter weight than other comparative board materials.

In one exemplary embodiment, the structure of the polyamic acid may be represented by Formula 1:

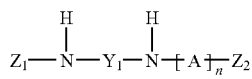
(1)

wherein A is represented by Formula 2:

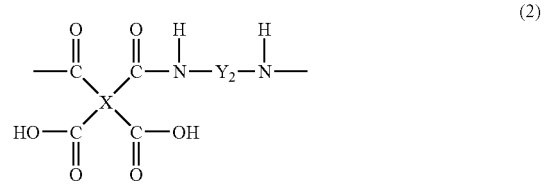

in which X is a tetravalent aliphatic or aromatic organic group and $Y_2$ is a divalent aliphatic or aromatic organic group, $Z_1$ and $Z_2$, which may be identical to or different from each other, are independently a monovalent crosslinkable functional group having at least one carbon-carbon double bond, $Y_1$, which may be identical to or different from $Y_2$, is a divalent aliphatic or aromatic organic group, and n is an integer from 1 to about 1,000, provided that when n is 2 or greater, the repeating units A may be the same or different.

In one exemplary embodiment, the number average molecular weight of the polyamic acid may be in the range of about 1,000 to about 90,000 grams per mole, but is not particularly limited to this range.

In one exemplary embodiment, the polyamic acid and the liquid crystal polymer or the liquid crystalline thermoset oligomer are mixed in a weight ratio of about 1:9 to about 9:1. The addition of the polyamic acid in an amount that is greater than the weight ratio of polyamic acid to liquid crystal polymer or the liquid crystalline thermoset oligomer of 9:1 may result in a minimal improvement in thermal properties.

The polyamic acid can be prepared by processes known to those skilled in the art. For example, the polyamic acid is synthesized in accordance with the following procedure. First, a dianhydride compound is sufficiently polymerized with a diamine compound in an aprotic solvent (e.g., NMP) for about 2 hours. To the reaction mixture is added a monoamine or monoanhydride compound having at least one double or triple bond. The mixture is allowed to react for at least about 16 hours to yield a solution of the polyamic acid having crosslinkable functional groups introduced at both ends thereof.

Examples of X in Formula 2 include, but are not necessarily limited to, the following tetravalent organic groups

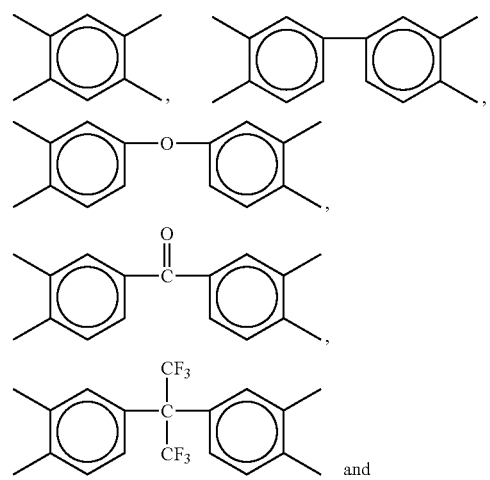

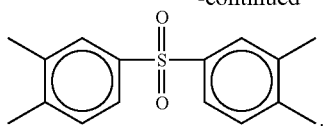

$Y_1$ and $Y_2$ in Formula 1 and 2 may be identical to or different from each other and are each independently a divalent organic group selected from the group consisting of, but not necessarily limited to,

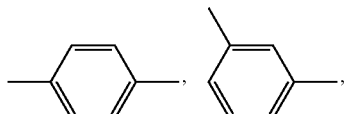
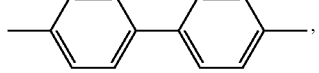
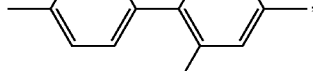
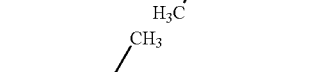
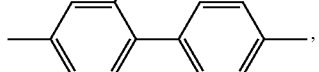
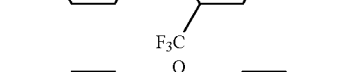
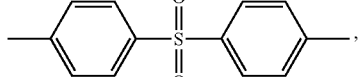
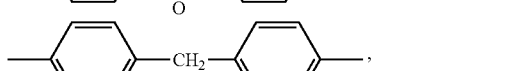
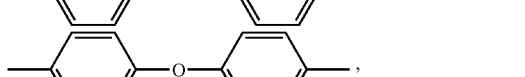
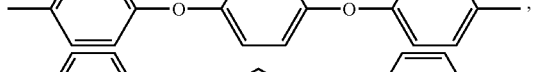

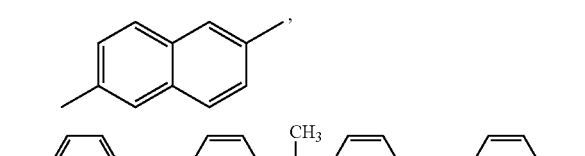
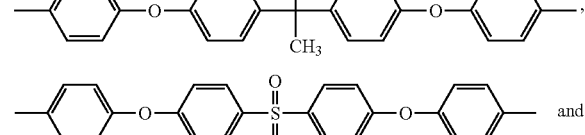
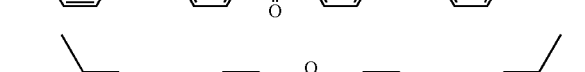 and
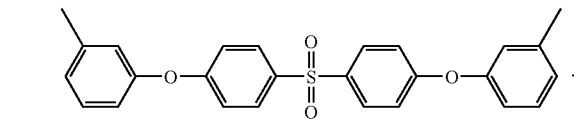

$Z_1$ and $Z_2$ in Formula 1 are each independently a monovalent organic group selected from the group consisting of

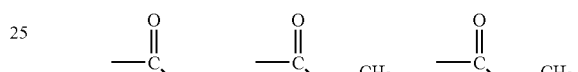
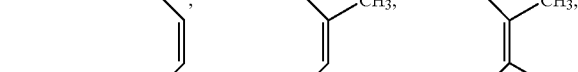
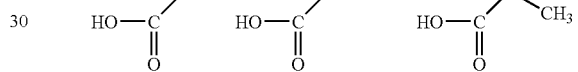
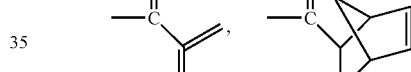
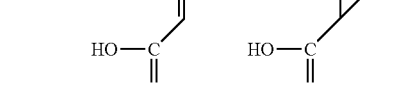
 and
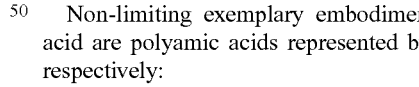

Non-limiting exemplary embodiments of the polyamic acid are polyamic acids represented by Formulae 3 and 4 respectively:

(3)

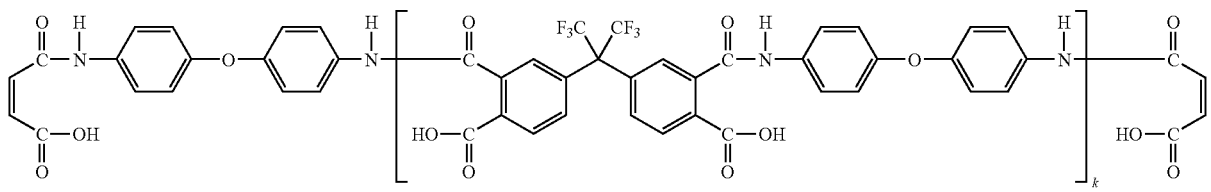

wherein k is from 1 to about 1,000;

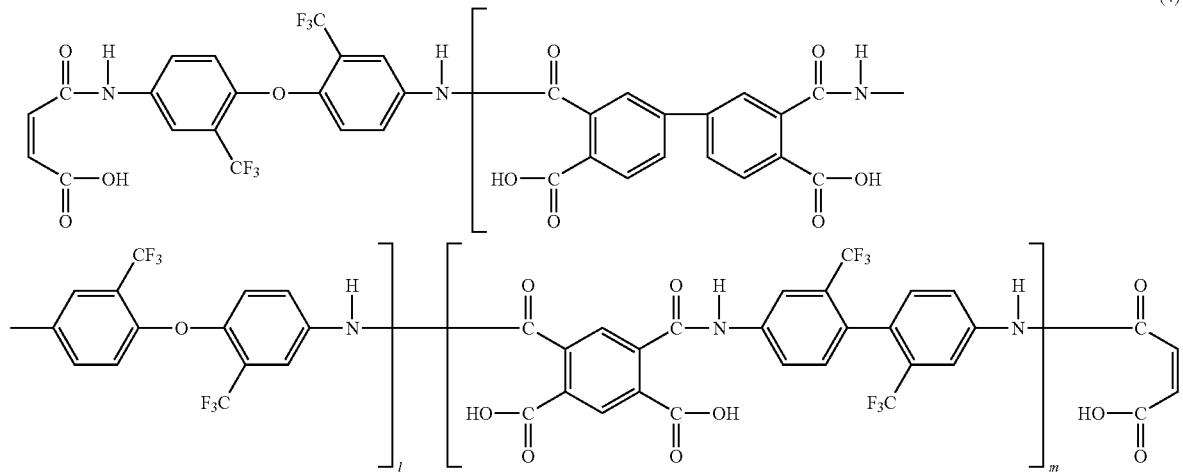

wherein l is from 1 to about 500 and m is from 1 to about 900.

In one exemplary embodiment, the liquid crystal polymer may be selected from the group consisting of, but not necessarily limited to, liquid crystal polyesters, liquid crystal polyamides, liquid crystal polyester amides, liquid crystal polyester imides, and liquid crystal polyamide imides.

In one exemplary embodiment, the liquid crystalline thermoset oligomer may be represented by Formula 5:

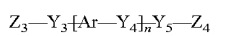

wherein $Y_3$, $Y_4$ and $Y_5$, may be identical to or different from each other and are each independently a divalent aliphatic or aromatic organic group containing at least one moiety selected from the group consisting of esters, amides, ethers and imides, Ar is a divalent aromatic organic group containing at least one aromatic structural unit selected from the group consisting of the units of Formulae 6:

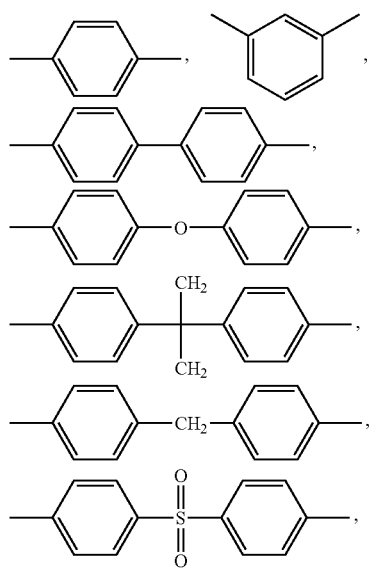

-continued

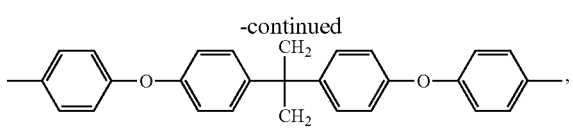

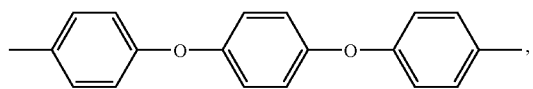

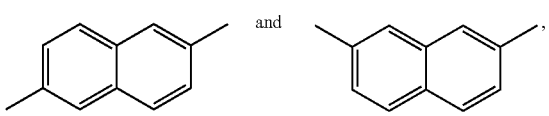

each aromatic ring being bonded directly to $Y_3$ and $Y_4$ or being bonded to $Y_3$ and $Y_4$ through at least one moiety selected from the group consisting of esters, amides, ethers and imides, $Z_3$ and $Z_4$, which may be identical to or different from each other, are each independently a monovalent organic group having at least one double or triple bond, and n is an integer from 1 to about 10,000.

When n in Formula 5 is 2 or greater, the repeating units —[Ar—$Y_4$]—may be the same or different. The aromatic rings Ar may be unsubstituted or substituted with an amide, ester, carboxyl, alkoxy, aryl or fluoromethyl group. The liquid crystalline thermoset oligomer may have one or two crosslinkable functional groups introduced at one or both ends thereof. The introduced crosslinkable functional groups may be the same or different. Examples of such crosslinkable functional groups include acetylene, cyanide, maleimide and nadimide groups, as already explained in Formula 1.

Exemplary embodiments of the liquid crystalline thermoset oligomer having one or two crosslinkable functional groups introduced at one or both ends thereof include, but are not necessarily limited to, liquid crystalline oligomers of Formulae 7 and 8:

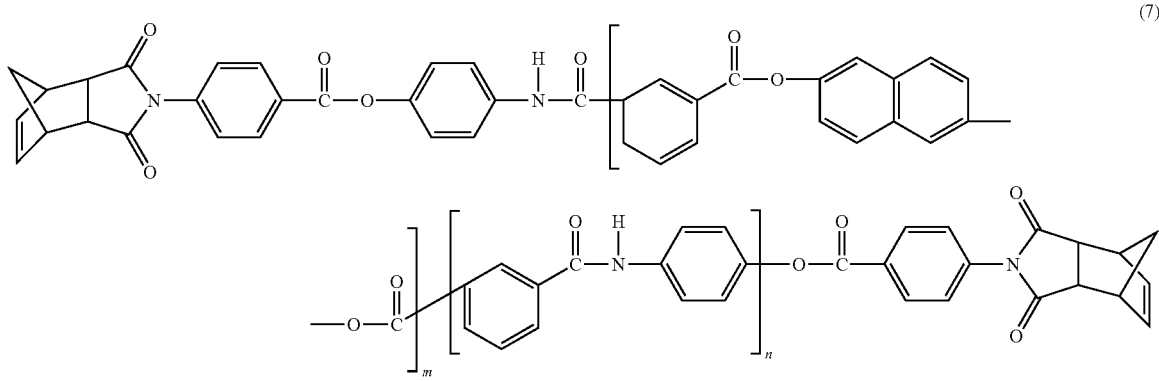

(7)

wherein m and n are each independently from 1 to about 50;

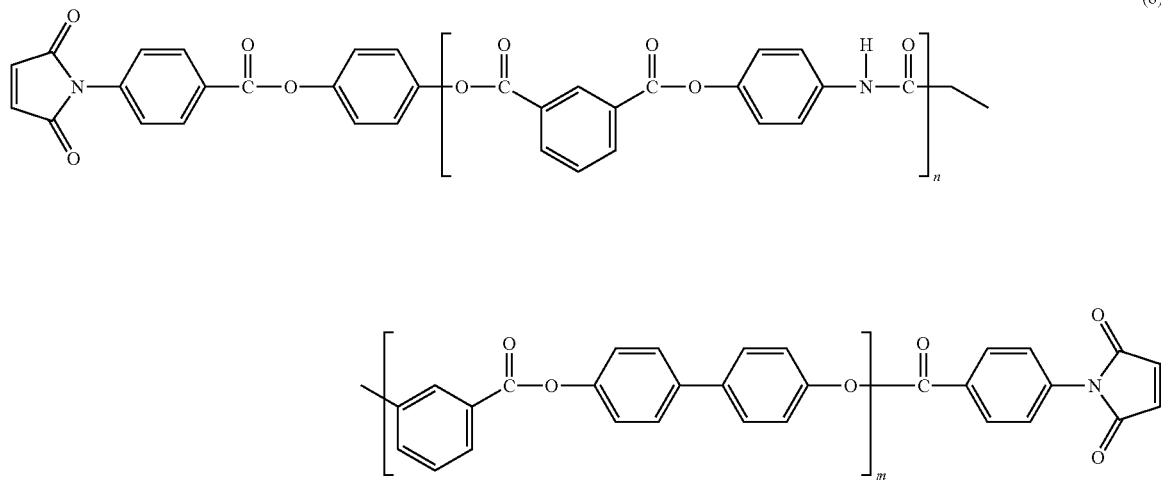

(8)

wherein m and n are each independently from 1 to about 50.

There is no particular restriction to the preparation method for the liquid crystalline thermoset oligomer. For example, solution or bulk polymerization can be carried out in one reaction tank equipped with suitable stirring means to prepare the liquid crystalline thermoset oligomer. Specifically, the liquid crystalline thermoset oligomer can be prepared by the reaction of at least one aromatic, heterocyclic or aliphatic dicarboxylic acid, an aromatic, heterocyclic or aliphatic diol, a heterocyclic or aliphatic diamine, a hydroxybenzoic acid, and an aminobenzoic acid.

The liquid crystalline thermoset oligomer may be prepared by solution polymerization or by bulk polymerization. The preparation of the liquid crystalline thermoset oligomer by solution polymerization is explained below as follows. First, isophthaloyl chloride, aminophenol, 2,6-dihydroxynaphthalene and triethylamine are reacted in a reactor with stirring at room temperature. After the passage of a predetermined time, e.g., about 30 to about 60 hours, the reaction mixture is reacted with 4-maleimidobenzoyl chloride, which serves as a source of terminal reactive groups to obtain a crude product. The crude product is isolated and purified to give the desired liquid crystalline thermoset oligomer having one or two crosslinkable functional groups. The crosslinking functional groups are introduced at one or both ends of the liquid crystalline thermoset oligomer.

The liquid crystalline thermoset oligomer is prepared by bulk polymerization in accordance with the following procedure. First, isophthalic acid, aminophenol, 2-hydroxy-6-naphthoic acid and acetic anhydride are introduced into a reactor and slowly heated to about 150° C. with stirring. The mixture is allowed to react at reflux for about 3 hours. By-products such as acetic acid and any unreacted acetic anhydride are removed from the reaction mixture. After 4-hydroxybenzoic acid is added, the temperature is raised to about 320° C. and the reaction is allowed to proceed. As a result of the reaction, a liquid crystal oligomer having alcohol groups at both ends thereof is synthesized. As depicted in Reaction 1, the liquid crystal oligomer is dissolved in a suitable solvent (e.g., DMF), and then a compound (e.g., 4-maleimidobenzoyl chloride) capable of attaching maleimide, nadimide, cyanide or acetylene groups to both ends of the liquid crystal oligomer is added to the solution. The mixture is allowed to react to give a liquid crystalline thermoset oligomer having acetylene, maleimide, cyanide or nadimide groups introduced at both ends of the molecule.

Reaction 1

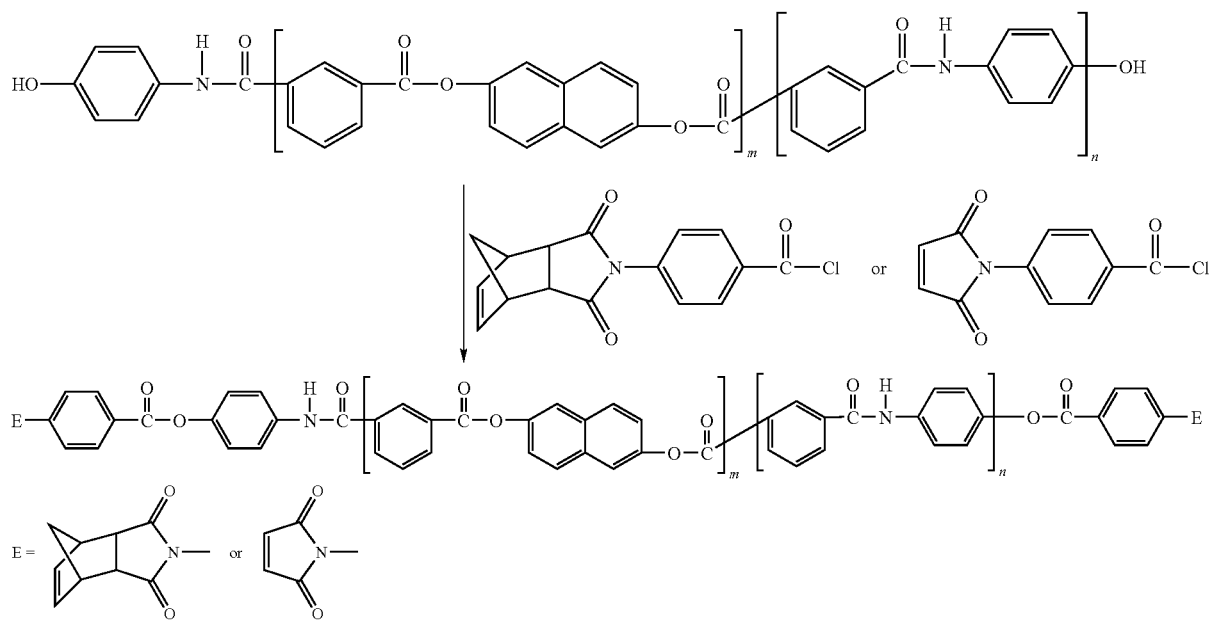

Examples of aromatic dicarboxylic acids suitable for the provision of carboxylic acid groups in the structural units include terephthalic acid, isophthalic acid, 2,6-naphthalenedicarboxylic acid, 1,5-naphthalenedicarboxylic acid, 4,4'-biphenyldicarboxylic acid, methylterephthalic acid, methylisophthalic acid, diphenyl ether-4,4'-dicarboxylic acid, diphenylsulfone-4,4'-dicarboxylic acid, diphenyl ketone-4,4'-dicarboxylic acid, and 2,2'-diphenylpropane-4,4'-dicarboxylic acid. These carboxylic acids may be used alone or in combination of two or more thereof.

Examples of suitable ester-forming derivatives of aromatic hydroxycarboxylic acids and aromatic hydroxylamines for the provision of phenolic hydroxyl groups include compounds that are converted to derivatives capable of forming ester groups from phenolic hydroxyl groups and carboxylic acids by transesterification. Examples of suitable amide-forming derivatives of aromatic diamines and aromatic hydroxylamines for the provision of amide groups include compounds that are converted to derivatives capable of forming amide groups from amino groups and carboxylic acids by condensation.

The liquid crystalline thermoset oligomer may contain about 10 to about 50 mole percent (mol %) of a soluble structural unit derived from an aromatic amine. This molar percent is based on the total number of moles of the constituent structural units. If the content of the soluble structural unit is less than about 10 mol %, the improvement in the solubility of the liquid crystalline thermoset oligomer in a solvent is negligible. Meanwhile, if the content of the soluble group exceeds about 50 mol %, the hydrophilicity of the liquid crystalline thermoset oligomer increases, resulting in deterioration of moisture resistance.

The organic solvent is used for solvent casting of the composition.

There is no particular limitation to the kind of the organic solvent that may be used in the composition. The organic solvent may be selected from N,N-dimethylacetamide, N-methylpyrrolidone, N-methylcaprolactam, N,N-dimethylformamide, N,N-diethylformamide, N,N-diethylacetamide, N-methylpropionamide, dimethylsulfoxide, γ-butyrolactone, dimethylimidazolidinone, tetramethylphosphoramide, ethyl cellosolve acetate, or the like, or mixtures thereof.

The composition may comprise the polyamic acid having one or two crosslinkable functional groups introduced at one or both ends thereof, the liquid crystal polymer and the organic solvent. The liquid crystalline thermoset oligomer may be used in lieu of the liquid crystal polymer. In one exemplary embodiment, the composition may comprise about 5 to about 100 parts by weight of the polyamic acid, about 5 to about 100 parts by weight of the liquid crystal polymer or the liquid crystalline thermoset oligomer, and about 100 parts by weight of the organic solvent.

In one exemplary embodiment, the composition may further comprise an inorganic filler. In one exemplary embodiment, the inorganic filler may be selected from the group consisting of, but not necessarily limited to, silica, aluminum borate, potassium titanate, magnesium sulfate, silicon carbide, zinc oxide, silicon nitride, silicon dioxide, aluminum titanate, barium titanate, barium strontium titanate, aluminum oxide, and the like, and mixtures thereof.

The composition may optionally further comprise one or more additives selected from the group consisting of fillers, softeners, plasticizers, lubricants, antistatic agents, colorants, antioxidants, heat stabilizers, light stabilizers and UV absorbers. Suitable fillers are organic fillers, such as epoxy, melamine, urea, benzoguanamine and styrene resin powders.

The composition can be used as a next-generation packaging material for applications where high heat resistance and low thermal expansion properties are desirable. The composition can be molded into a board or dissolved in a suitable solvent to prepare a varnish for impregnation applications or coating applications. Other applications of the composition include laminates, printed circuit boards, constituent layers of multilayer boards, resin-coated copper foils, copper clad laminates, polyimide films, TAB films and prepregs, but are not limited thereto.

For example, a printed circuit board can be produced by casting the composition, which comprises the polyamic acid, the liquid crystal polymer or the liquid crystalline thermoset oligomer and the organic solvent, on a substrate to form a thin film, followed by high-temperature curing. Curing of the composition, which is a mixture of the liquid crystal polymer or the liquid crystalline thermoset oligomer and the polyamic acid causes the formation of a polyimide having a high-density crosslinked structure to be introduced into the liquid crystal polymer, thus achieving markedly improved mechanical and thermal properties.

The composition can be prepared by any process known in the art, for example, by the following procedure. First, the polyamic acid having one or two crosslinkable groups introduced at one or both ends thereof and the liquid crystal polymer or the liquid crystalline thermoset oligomer are dissolved in the solvent. Then, the solution is thermally cured at a temperature of 250° C. to 350° C. to imidize the polyamic acid to a modified polyimide. The polyamic acid is mixed with the liquid crystal polymer or the liquid crystalline thermoset oligomer in a weight ratio of about 1:9 to about 9:1, specifically about 2:8 to about 8:2, and more specifically about 3:7 to about 7:3.

In accordance with another exemplary embodiment, a film or prepreg can be produced using the composition. Specifically, the film is produced by casting the composition on a substrate and the prepreg is produced by impregnating the composition into a reinforcing material. Non-limiting exemplary embodiments of the reinforcing material include glass cloth, woven alumina glass fibers, glass fiber non-woven fabrics, cellulose non-woven fabrics, woven carbon fibers, polymer fabrics, and the like, and combinations thereof.

The prepreg can be produced by impregnating a glass fiber with the composition and removing the solvent. The impregnation can be carried out by any technique known in the art, such as dip coating or roll coating.

A copper clad laminate can be produced by applying the composition to a copper foil or casting the composition on a copper foil, removing the solvent and annealing the copper foil with the composition disposed thereon. The solvent is preferably removed by evaporation. For example, the evaporation may be carried out under reduced pressure (e.g., the application of a vacuum) or by flushing.

The composition can be applied to the substrate by various techniques, including roll coating, dip coating, spray coating, spin coating, curtain coating, slot coating and screen printing.

Fine impurities contained in the solution are removed by filtration before application to or casting on the copper foil.

In accordance with yet another exemplary embodiment, there is provided a printed circuit board comprising the prepreg. For example, the printed circuit board may be produced by stacking an inner circuit board, the prepreg and a copper foil (in accordance with a design specification), and melting/curing the prepreg in a press under pressure and heat to adhere the copper foil to the inner board.

A more detailed description of exemplary embodiments will be described in more detail with reference to the following examples. However, these examples are given merely for the purpose of illustration and are not to be construed as limiting the scope of the embodiments.

EXAMPLES

Synthesis Example 1

Synthesis of Polyamic Acid (PA01)

In this example, a polyamic acid (PA01) of Formula 9 having maleic acid groups introduced at least one end thereof was synthesized.

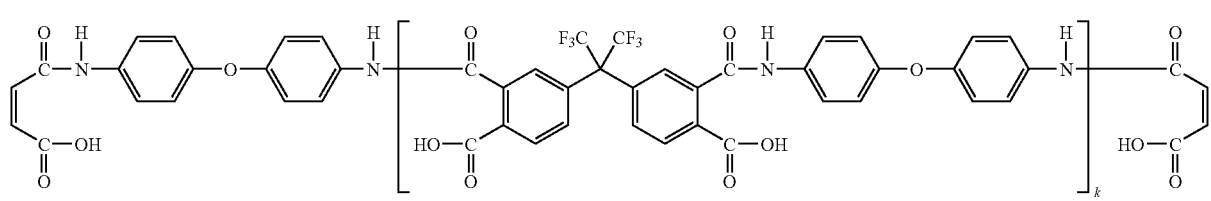

(9)

First, 10.01 grams (g) of oxydianiline (ODA) and 70.85 g of N-methylpyrrolidone (NMP) were sequentially introduced into a 1 liter (L) round-bottom jacketed reactor. The mixture was completely dissolved with slow stirring. To the solution was slowly added 18.88 g of 4,4'-(hexafluoroisopropylidene) diphthalic anhydride (6FDA) while maintaining the temperature of the reactor at about 0 to about 5° C. The mixture was dissolved with stirring. The solution was allowed to sufficiently react with stirring for 2 hours. 1.47 g of 5-norbornene-2,3-dicarboxylic anhydride (NDA) was slowly added to the reaction solution, followed by stirring at room temperature for 16 hours to afford the polyamic acid solution with 30 wt % solid content.

Synthesis Example 2

Synthesis of Polyamic Acid (PA02)

In this example, a polyamic acid (PA02) of Formula 10 having maleic acid groups was introduced at at least one end and the liquid crystals were synthesized.

(10)

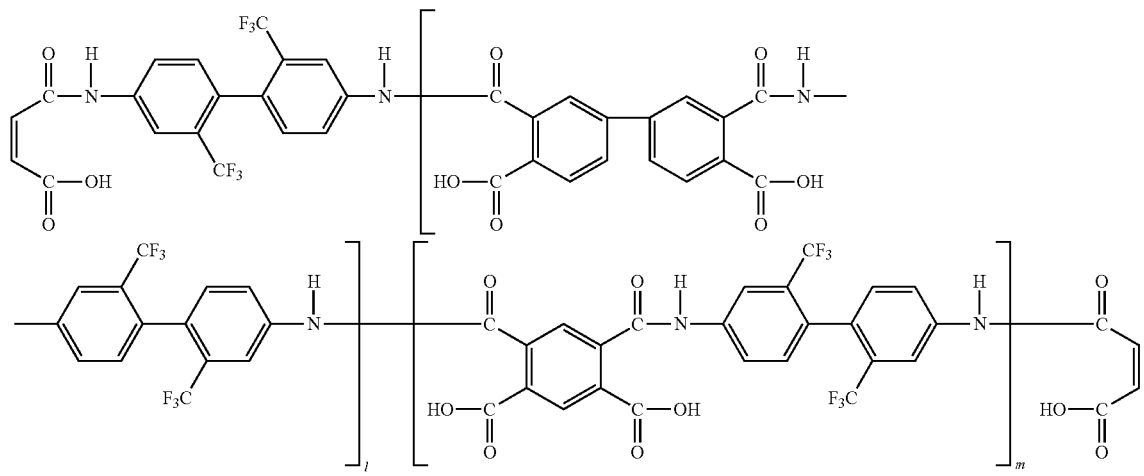

First, 9.61 g of 2,2'-bis(trifluoromethyl)benzidine (BTFB) and 51.1 g of NMP were sequentially introduced into a 1 L round-bottom jacketed reactor. The mixture was completely dissolved with slow stirring. To the solution were slowly added 2.78 g of pyromellitic dianhydride (PMDA) and 3.75 g of 4,4'-biphthalic anhydride (BPDA) while maintaining the temperature of the reactor at about 0 to about 5° C. The mixture was dissolved with stirring. The solution was allowed to sufficiently react with stirring for 2 hours. 0.88 g of maleic anhydride was slowly added to the reaction solution, followed by stirring at room temperature for 16 hours to produce the polyamic acid solution with a 25 wt % solids content.

Synthesis Example 3

Preparation of Liquid Crystal Polymer 8.3 g (0.05 mol) of isophthalic acid, 18.8 g (0.1 mol) of 6-hydroxy-2-naphthoic acid, 5.5 g (0.05 mol) of 4-aminophenol and 32.7 g (0.32 mol) of acetic anhydride were introduced into a 500 milliliter (ml) flask equipped with a condenser and a mechanical stirrer. The mixture was slowly heated to 150° C. under a nitrogen atmosphere and allowed to react (acetylation) for 4 hours while maintaining a constant reaction temperature.

After completion of the reaction, the temperature of the reaction mixture was slowly increased to 300° C. from 150° C. at heating rate of 1° C./min. During this process acetic acid was collected as a condensation byproduct. During the final stages of the polymerization the nitrogen flow was cut off and a vacuum was applied in order to remove the last traces of acetic acid. The resulting product was removed from the reaction flask and processed into a powder using a cutting mill. To ensure that all acetic acid was removed we dried the powder under vacuum at 80° C. for 24 hours.

Synthesis Example 4

Synthesis of Liquid Crystalline Thermoset Oligomer 3.274 g (0.03 mol) of 4-aminophenol, 4.655 g (0.025 mol) of 4,4-dihydroxybiphenyl and 18 ml of triethylamine were dissolved in 100 ml of dimethylformamide in a 250 ml flask. The flask was cooled in ice-water and 10.151 g (0.05 mol) of isophthaloyl chloride was added to the flask. The mixture was allowed to react at room temperature for 60 hours. The reaction mixture was purified using water and ethanol, and dried.

1 g of the dried sample was dissolved in 9 g of NMP. To the solution were added 0.1 g of 4-maleimidobenzoyl chloride and 10 ml of triethylamine. The mixture was allowed to react at room temperature for 12 hours, thereby producing the liquid crystalline thermoset oligomer of Formula 8 having maleimide reactive groups introduced at both ends thereof.

Example 1

1.6 g of the liquid crystal polymer (polyamide ester) prepared in Synthesis Example 3 and 1.33 g of the polyamic acid solution (30 wt % in NMP) prepared in Synthesis Example 1 were dissolved in 7.07 g of NMP. The resulting solution was impregnated into a woven glass fabric having a thickness of 90 μm and a size of 5×5 cm². The specimen was placed on copper foil and dried in a convection oven at 100° C. for 20 minutes. Thermal curing was carried out in an electronic furnace (KDF S-80) with a multi-step process that comprises successive heating at 5° C./minute up to 200° C., holding at 200° C. for 60 minutes, heating at 3° C./min up to 290° C., and holding at 290° C. for 30 minutes. The specimen was treated with 50 parts by weight (500 ml) of nitric acid solution to completely remove the copper foil, leaving behind a prepreg only. The weight ratio of the polymer blend to the weight of the resulting prepreg was 55 wt %. The glass transition temperature ($T_g$) and the coefficient of thermal expansion (CTE) of the prepreg were measured using a thermomechanical analyzer (TMA 2940, TA Instruments) The results are shown in Table 1.

Example 2

1.4 g of the liquid crystal polymer (polyamide ester) prepared in Synthesis Example 3 and 2.4 g of the polyamic acid solution (25 wt % in NMP) prepared in Synthesis Example 2 were dissolved in 6.2 g of NMP. The resulting solution was impregnated into a woven glass fabric having a thickness of 90 μm and a size of 25 square centimeters (5×5 cm²). The specimen was placed on copper foil and dried in a convection oven at 100° C. for 20 minutes. Thermal curing was carried out in an electronic furnace (KDF S-80) with a multi-step process: successive heating at 5° C./min up to 200° C., holding 200° C. for 60 minutes, heating at 3°° C./min up to 290°

C., and holding at 290° C. for 30 minutes. The specimen was treated with 50 parts by weight of nitric acid solution to completely remove the copper foil, leaving behind only a prepreg. The weight ratio of the polymer blend to the weight of the resulting prepreg is 53 wt %. The glass transition temperature ($T_g$) and the coefficient of thermal expansion (CTE) of the prepreg were measured by the same method as in Example 1. The results are shown in Table 1.

Example 3

1.6 g of the liquid crystalline thermoset oligomer prepared in Synthesis Example 4 and 1.33 g of the polyamic acid solution (30 wt % in NMP) prepared in Synthesis Example 1 were dissolved in 7.07 g of NMP. The resulting solution was impregnated into a woven glass fabric having a thickness of 90 μm and a size of 5×5 cm². The specimen was placed on copper foil and dried in a convection oven at 100° C. for 20 minutes. Thermal curing was carried out in an electronic furnace (KDF S-80) with a multi-step process: successive heating at 5° C./min up to 200° C., holding at 200° C. for 60 minutes, heating at 3° C./minute up to 290° C., and holding at 290° C. for 30 minutes. The specimen was treated with 50 parts by weight of nitric acid solution to completely remove the copper foil, leaving a prepreg only. The weight ratio of the polymer blend to the weight of the resulting prepreg is 53 wt %. The glass transition temperature ($T_g$) and the coefficient of thermal expansion (CTE) of the prepreg were measured by the same method as in Example 1. The results are shown in Table 1.

Example 4

A prepreg was produced in the same manner as in Example 3 except that 1.4 g of the liquid crystalline thermoset oligomer prepared in Synthesis Example 4 and 2.4 g of the polyamic acid solution (25 wt % in NMP) prepared in Synthesis Example 2 were dissolved in 6.2 g of NMP. The weight ratio of the polymer blend to the weight of the resulting prepreg is 53 wt %. The glass transition temperature ($T_g$) and the coefficient of thermal expansion (CTE) of the prepreg were measured by the same method as in Example 1. The results are shown in Table 1.

Comparative Example 1

1 g of the liquid crystal polymer prepared in Synthesis Example 3 was dissolved in 4 g of NMP at 120° C. for about one hour. The resulting solution was impregnated into a woven glass fabric having a thickness of 90 μm and a size of 5×5 cm². The specimen was placed on copper foil and dried in a convection oven at 100° C. for 20 minutes. Thermal curing was carried out in an electronic furnace (KDF S-80) with a multi-step process: successive heating at 5° C./minute up to 200° C., holding at 200° C. for 60 minute, heating at 3° C./min up to 290° C., and holding at 290° C. for 30 minute. The specimen was treated with 50 parts by weight of nitric acid solution to completely remove the copper foil, leaving a prepreg only. The weight ratio of the polymer blend to the weight of the resulting prepreg is 54 wt %. The glass transition temperature ($T_g$) and the coefficient of thermal expansion (CTE) of the prepreg were measured by the same method as in Example 1. The results are shown in Table 1.

TABLE 1

| | Composition | Glass transition temperature (° C.) | CTE (ppm/° C.) |
|---|---|---|---|
| Example 1 | LCP:PA01 = 8:2 | ND (Disappeared) | 11.50 |
| Example 2 | LCP:PA02 = 7:3 | 259.91 | 5.7 |
| Example 3 | LCT:PA01 = 8:2 | 216.96 | 9.7 |
| Example 4 | LCT:PA02 = 7:3 | 200.28 | 7.4 |
| Comparative Example 1 | LCP | 128.12 | 13.9 |

Note
CTE was calculated in the temperature range of 50-150° C.
PA01: Polyamic acid prepared in Synthesis Example 1
PA02: Polyamic acid prepared in Synthesis Example 2
LCP: Liquid crystal polymer prepared in Synthesis Example 3
LCT: Liquid crystalline thermoset oligomer prepared in Synthesis Example 4

The results in Table 1 show that the compositions of Examples 1 to 4 had glass transition temperatures higher 200° C. and the base resins had coefficients of thermal expansion lower than 15 ppm/° C., indicating that the compositions are suitable for use in the production of boards. In contrast, the compositions prepared using the liquid crystal polymer only in Comparative Examples 1 had glass transition temperatures lower than 200° C., although they met the requirement for CTE.

Although exemplary embodiments have been described herein with reference to the foregoing embodiments, those skilled in the art will appreciate that various modifications and changes are possible without departing from the spirit of the invention as disclosed in the accompanying claims. Therefore, it is to be understood that such modifications and changes are encompassed within the scope of the invention.

What is claimed is:
1. A composition for producing a printed circuit board, comprising a polyamic acid having a crosslinkable functional group located at both ends thereof, a liquid crystal polymer or a liquid crystalline thermoset oligomer and an organic solvent wherein the polyamic acid has a structure represented by Formula 1:

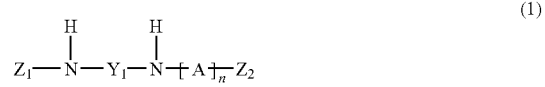

wherein A is represented by Formula 2:

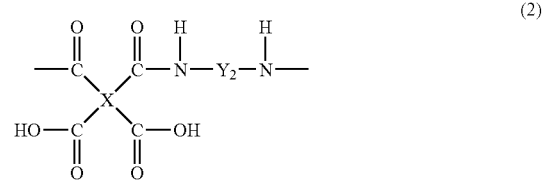

in which X is a tetravalent aliphatic or aromatic organic group and $Y_2$ is a divalent aliphatic or aromatic organic group, $Z_1$ and $Z_2$, which are identical to or different from each other, each representing a monovalent crosslinkable functional group having at least one carbon-carbon double bond, $Y_1$, which is identical to or different from $Y_2$, represents a divalent aliphatic or aromatic organic group, and n is an integer from about 1 to about 1,000, provided that when n is 2 or greater, the repeating units A are the same or different.

2. The composition of claim 1, wherein the polyamic acid has a number average molecular weight of about 1,000 to about 90,000 grams per mole.

3. The composition of claim 1, wherein the polyamic acid and the liquid crystal polymer or the liquid crystalline thermoset oligomer are mixed in a weight ratio of about 1:9 to about 9:1.

4. The composition of claim 1, wherein in Formula 1, X is a tetravalent organic group selected from the group consisting of

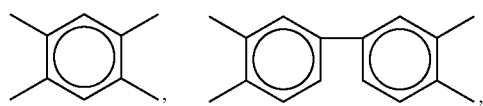

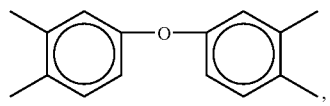

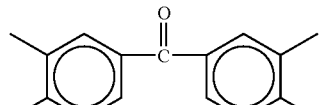

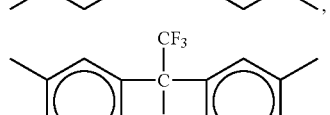

and

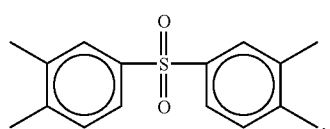

$Y_1$ and $Y_2$ are each independently a divalent organic group selected from the group consisting of

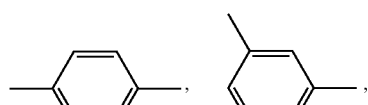

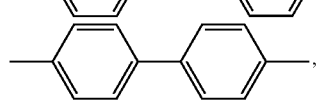

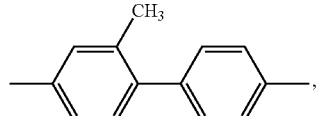

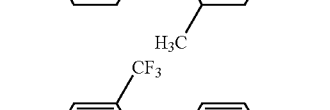

-continued

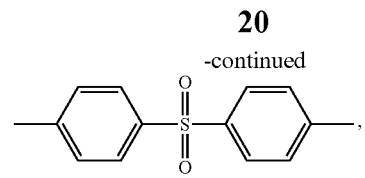

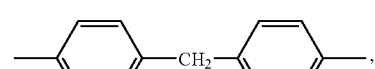

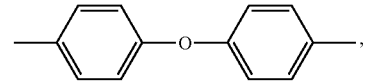

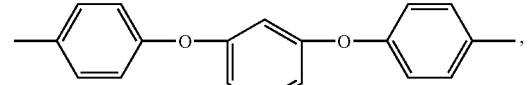

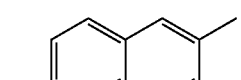

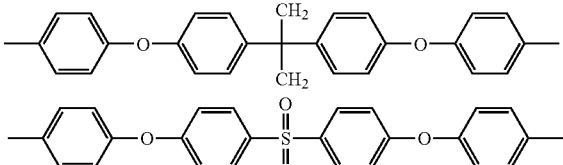

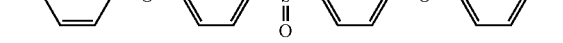

and

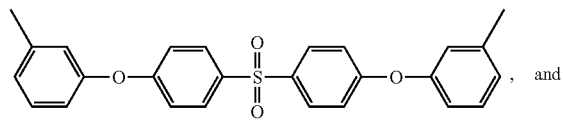, and $Z_1$ and $Z_2$ are each independently selected from the group consisting of

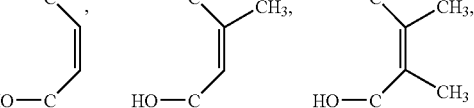 and

5. The composition of claim 1, wherein the polyamic acid is represented by Formula 3 or 4:

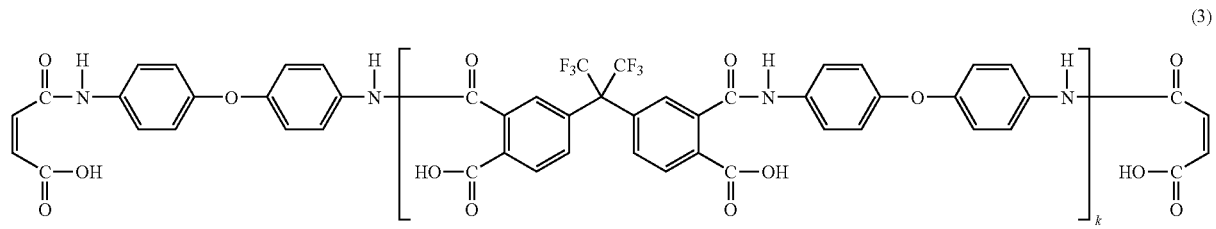

wherein k is from about 1 to about 1,000;

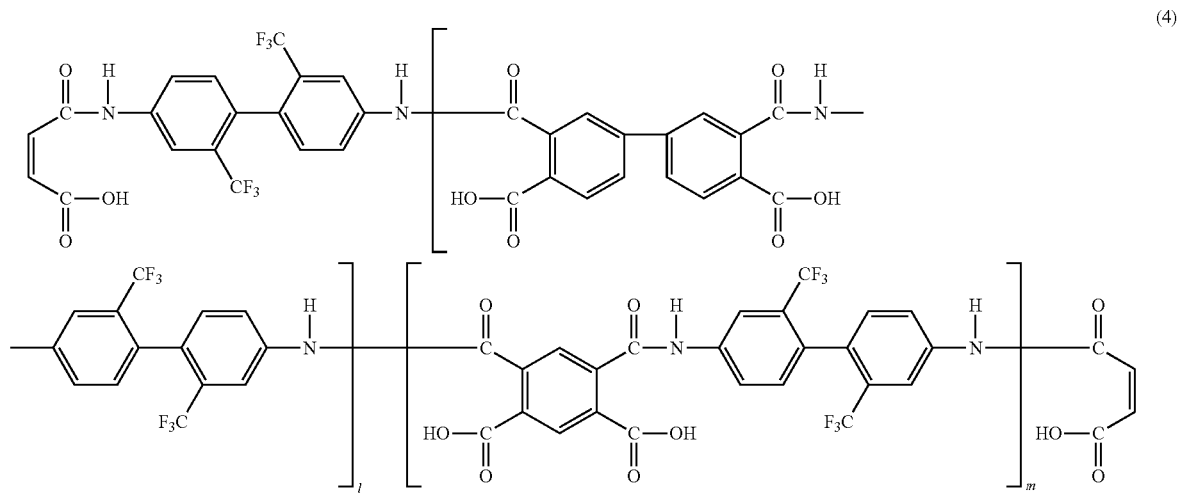

wherein l is from about 1 to about 500 and m is from about 1 to about 900.

6. The composition of claim 1, wherein the liquid crystal polymer is selected from the group consisting of liquid crystal polyesters, liquid crystal polyamides, liquid crystal polyester amides, liquid crystal polyester imides, liquid crystal polyamide imides, and mixtures thereof.

7. The composition of claim 1, wherein the liquid crystalline thermoset oligomer is represented by Formula 5:

wherein $Y_3$, $Y_4$ and $Y_5$, which are identical to or different from each other, each representing a divalent aliphatic or aromatic organic group containing at least one moiety selected from the group consisting of esters, amides, ethers and imides, Ar is a divalent aromatic organic group containing at least one aromatic structural unit selected from the group consisting of the units of Formulae 6:

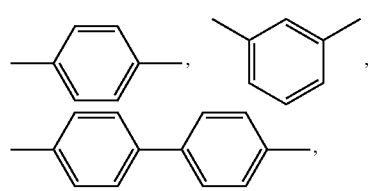

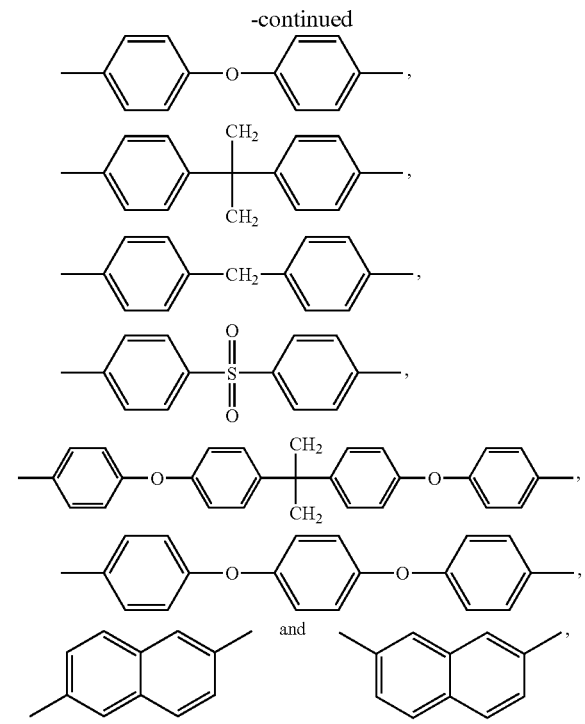

each aromatic ring being bonded directly to $Y_3$ and $Y_4$ or being bonded to $Y_3$ and $Y_4$ through at least one moiety selected from the group consisting of esters, amides, ethers and imides, $Z_3$ and $Z_4$, which are identical to or different from each other, each represents a monovalent organic group having at least one double or triple bond, and n is an integer from about 1 to about 10,000.

8. The composition of claim 1, further comprising an inorganic filler.

9. The composition of claim 8, wherein the inorganic filler is selected from the group consisting of silica, aluminum borate, potassium titanate, magnesium sulfate, silicon carbide, zinc oxide, silicon nitride, silicon dioxide, aluminum titanate, barium titanate, barium strontium titanate, aluminum oxide, and mixtures thereof.

10. The composition of claim 1, wherein the composition comprises about 5 to about 100 parts by weight of the polyamic acid, about 5 to about 100 parts by weight of the liquid crystal polymer or the liquid crystalline thermoset oligomer, and about 100 parts by weight of the organic solvent.

11. A film produced by solvent casting a composition for producing a printed circuit board, the composition comprising a polyamic acid having a crosslinkable functional group located at both ends thereof, a liquid crystal polymer or a liquid crystalline thermoset oligomer and an organic solvent wherein the polyamic acid has a structure represented by Formula 1:

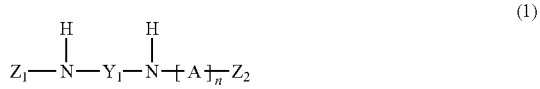

wherein A is represented by Formula 2:

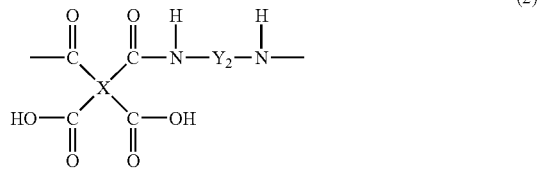

in which X is a tetravalent aliphatic or aromatic organic group and $Y_2$ is a divalent aliphatic or aromatic organic group, $Z_1$ and $Z_2$, which are identical to or different from each other, each representing a monovalent crosslinkable functional group having at least one carbon-carbon double bond, $Y_1$, which is identical to or different from $Y_2$, represents a divalent aliphatic or aromatic organic group, and n is an integer from about 1 to about 1,000, provided that when n is 2 or greater, the repeating units A are the same or different.

12. A prepreg produced by impregnating a reinforcing material with a composition for producing a printed circuit board, the composition comprising a polyamic acid having a crosslinkable functional group located at both ends thereof, a liquid crystal polymer or a liquid crystalline thermoset oligomer and an organic solvent wherein the polyamic acid has a structure represented by Formula 1:

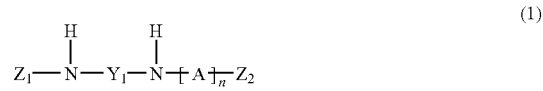

wherein A is represented by Formula 2:

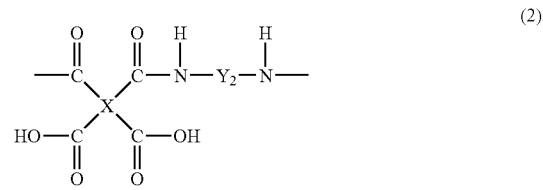

in which X is a tetravalent aliphatic or aromatic organic group and $Y_2$ is a divalent aliphatic or aromatic organic group, $Z_1$ and $Z_2$, which are identical to or different from each other, each representing a monovalent crosslinkable functional group having at least one carbon-carbon double bond, $Y_1$, which is identical to or different from $Y_2$, represents a divalent aliphatic or aromatic organic group, and n is an integer from about 1 to about 1,000, provided that when n is 2 or greater, the repeating units A are the same or different.

13. The prepreg of claim 12, wherein the reinforcing material is selected from the group consisting of glass cloth, woven alumina glass fibers, glass fiber non-woven fabrics, cellulose non-woven fabrics, woven carbon fibers, polymer fabrics, and combinations thereof.

14. A printed circuit board comprising a prepreg produced by impregnating a reinforcing material with a composition for producing a printed circuit board, the composition comprising a polyamic acid having a crosslinkable functional group located at both ends thereof, a liquid crystal polymer or a liquid crystalline thermoset oligomer and an organic solvent wherein the polyamic acid has a structure represented by Formula 1:

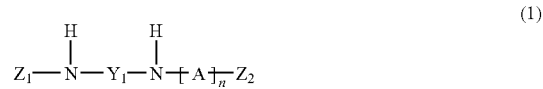

wherein A is represented by Formula 2:

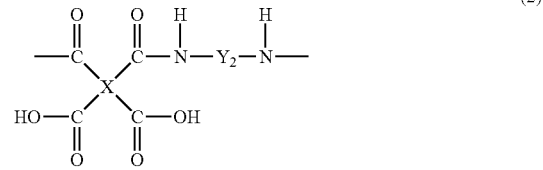

in which X is a tetravalent aliphatic or aromatic organic group and $Y_2$ is a divalent aliphatic or aromatic organic group, $Z_1$ and $Z_2$, which are identical to or different from each other, each representing a monovalent crosslinkable functional group having at least one carbon-carbon double bond, $Y_1$, which is identical to or different from $Y_2$, represents a divalent aliphatic or aromatic organic group, and n is an integer from about 1 to about 1,000, provided that when n is 2 or greater, the repeating units A are the same or different.

* * * * *